United States Patent
Wang et al.

(10) Patent No.: US 10,403,794 B2
(45) Date of Patent: Sep. 3, 2019

(54) SEMICONDUCTOR DEVICE

(71) Applicant: EPISTAR CORPORATION, Hsinchu (TW)

(72) Inventors: Yu-Shou Wang, Hsinchu (TW); Dian-Ying Hu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/938,855

(22) Filed: Mar. 28, 2018

(65) Prior Publication Data

US 2018/0287015 A1 Oct. 4, 2018

Related U.S. Application Data

(60) Provisional application No. 62/478,966, filed on Mar. 30, 2017.

(51) Int. Cl.
*H01L 33/32* (2010.01)
*H01L 33/02* (2010.01)
*H01L 33/04* (2010.01)

(52) U.S. Cl.
CPC .......... *H01L 33/32* (2013.01); *H01L 33/025* (2013.01); *H01L 33/04* (2013.01)

(58) Field of Classification Search
CPC ..................................................... H01L 33/32
See application file for complete search history.

(56) References Cited

U.S. PATENT DOCUMENTS

| 7,002,184 B2 | 2/2006 | Oku et al. | |
| 7,612,363 B2 | 11/2009 | Takeda et al. | |
| 8,258,525 B2 | 9/2012 | Kim | |
| 2010/0044674 A1* | 2/2010 | Kim | H01L 33/04 257/13 |
| 2011/0140083 A1* | 6/2011 | Driscoll | H01L 21/0237 257/15 |
| 2015/0311382 A1* | 10/2015 | Kim | H01L 33/06 257/13 |

* cited by examiner

*Primary Examiner* — Sitaramarao S Yechuri
(74) *Attorney, Agent, or Firm* — Ditthavong & Steiner P.C.

(57) ABSTRACT

The semiconductor device includes a first conductivity-type semiconductor structure comprising a first stack and a second stack, wherein the first stack comprises alternate first layers and second layers, the second stack comprises alternate third layers and fourth layers. The semiconductor device includes a second conductivity-type semiconductor structure on the first conductivity-type semiconductor and includes an active structure between the first conductivity-type semiconductor structure and the second conductivity-type semiconductor structure. The first stack is between the active structure and the second stack, and a first difference between a maximum of the first doping concentration of one of the first layers and a minimum of the second doping concentration of one of the second layers is less than a second difference between a maximum of the third doping concentration of one of the third layers and a minimum of the fourth doping concentration of one of the fourth layers.

19 Claims, 4 Drawing Sheets

SEMICONDUCTOR DEVICE

CROSS REFERENCE TO RELATED APPLICATIONS

This application claims the benefit of US Provisional Application Ser. No. 62/478,966, filed on Mar. 30, 2017, the entire content of which is hereby incorporated by reference.

TECHNICAL FIELD

The disclosure relates to a semiconductor device, and particularly to a semiconductor device including a first conductivity-type semiconductor structure including a stack.

DESCRIPTION OF BACKGROUND ART

Light-emitting diodes (LEDs) are widely used as solid-state light sources. Compared to conventional incandescent light lamps or fluorescent light tubes, LEDs have advantages such as lower power consumption and longer lifetime, and therefore LEDs gradually replace the conventional light sources and are applied to various fields such as traffic lights, back light modules, street lighting, and biomedical device.

SUMMARY OF THE DISCLOSURE

The present disclosure provides a semiconductor device. The semiconductor device includes a first conductivity-type semiconductor structure including a first stack and a second stack, wherein the first stack includes alternate first layers and second layers, the second stack includes alternate third layers and fourth layers, each of the first layers has a first doping concentration, each of the second layers has a second doping concentration, each of the third layers has a third doping concentration, and each of the fourth layers has a fourth doping concentration; a second conductivity-type semiconductor structure on the first conductivity-type semiconductor; and an active structure between the first conductivity-type semiconductor structure and the second conductivity-type semiconductor structure; wherein the first stack is between the active structure and the second stack, and a first difference between a maximum of the first doping concentration of one of the first layers and a minimum of the second doping concentration of one of the second layers is less than a second difference between a maximum of the third doping concentration of one of the third layers and a minimum of the fourth doping concentration of one of the fourth layers.

The present disclosure provides another semiconductor device. The semiconductor device includes: a first conductivity-type semiconductor structure including a first stack, wherein the first stack includes alternate first layers and second layers, each of the first layers has a first doping concentration and a first thickness, each of the second layers has a second doping concentration, the maximum of the first doping concentration of one of the first layers is greater than the minimum of the second doping concentration of one of the second layers; a second conductivity-type semiconductor structure on the first conductivity-type semiconductor; an active structure between the first conductivity-type semiconductor structure and the second conductivity-type semiconductor structure; and a semiconductor stack between the first conductivity-type semiconductor structure and the active structure, wherein the semiconductor stack includes alternate first semiconductor layers and second semiconductor layers, each of the first semiconductor layers includes a thickness, and the thickness of one of the first semiconductor layers is less than the first thickness of one of the first layers.

The present disclosure provides another semiconductor device. The semiconductor device includes: a first conductivity-type semiconductor structure including a first stack and a second stack, wherein the first stack includes alternate first layers and second layers, each of the first layers has a first doping concentration, each of the second layers has a second doping concentration, the maximum of the first doping concentration of one of the first layers is greater than the minimum of the second doping concentration of one of the second layers, the second stack includes alternate third layers and fourth layers, each of the third layers has a third doping concentration and a thickness, and each of the fourth layers has a fourth doping concentration, and the maximum of the third doping concentration of one of the third layers is greater than the minimum of the fourth doping concentration of one of the fourth layers; a second conductivity-type semiconductor structure on the first conductivity-type semiconductor; an active structure between the first conductivity-type semiconductor structure and the second conductivity-type semiconductor structure; a semiconductor stack between the first conductivity-type semiconductor structure and the active structure, wherein the semiconductor stack includes alternate first semiconductor layers and second semiconductor layers, each of the first semiconductor layers includes a thickness, and the thickness of one of the first semiconductor layers is less than the thickness of one of the third layers; and a first electrode on the second stack.

The present disclosure provides another semiconductor device. The semiconductor device, includes: a first conductivity-type semiconductor structure including a first stack, wherein the first stack includes alternate first layers and second layers, each of the first layers has a first doping concentration, each of the second layers has a second doping concentration, one of the first doping concentrations is greater than one of the second doping concentrations; a second conductivity-type semiconductor structure on the first conductivity-type semiconductor; an active structure between the first conductivity-type semiconductor structure and the second conductivity-type semiconductor structure; and a nitride-containing layer between the active structure and the first conductivity-type semiconductor structure, wherein the nitride-containing layer has a doping concentration lower than one of the first doping concentrations and one of the second doping concentrations.

The present disclosure provides another semiconductor device. The semiconductor device, includes: a first conductivity-type semiconductor structure including a first stack, wherein the first stack includes alternate first layers and second layers, each of the first layers has a first doping concentration, each of the second layers has a second doping concentration, one of the first doping concentrations is greater than one of the second doping concentrations; a second conductivity-type semiconductor structure on the first conductivity-type semiconductor; an active structure between the first conductivity-type semiconductor structure and the second conductivity-type semiconductor structure; a nitride-containing layer between the active structure and the first conductivity-type semiconductor structure, wherein the nitride-containing layer has a doping concentration lower than the first doping concentration of one of the first layers and lower than the second doping concentration of one of the second layers; and a spacer layer between the nitride-containing layer and the first conductivity-type semiconductor structure, wherein the spacer layer has a doping concentration less than the doping concentration of the nitride-containing layer.

The present disclosure provides a method for making a semiconductor device. The method includes: providing a substrate; forming a second stack on the substrate, including forming a third layer and forming a fourth layer, wherein the step of forming the third layer includes providing a dopant source at a first flow rate, the step of forming the fourth layer includes providing a dopant source at a second flow rate, and the second flow rate is less than the first flow rate; and forming a first stack on the second stack, including forming a first layer and forming a second layer, wherein the step of forming the first layer includes providing a dopant source at a third flow rate, the step of forming the second layer includes providing a dopant source at a fourth flow rate, and the fourth flow rate is less than the third flow rate, and the third flow rate is less than the first flow rate.

BRIEF DESCRIPTION OF THE DRAWINGS

The foregoing aspects and many of the attendant advantages of this disclosure will become more readily appreciated as the same becomes better understood by reference to the following detailed description, when taken in conjunction with the accompanying drawings, wherein.

DETAILED DESCRIPTION OF PREFERRED EMBODIMENTS

Exemplary embodiments of the present disclosure will be described in detail with reference to the accompanying drawings hereafter. The following embodiments are given by way of illustration to help those skilled in the art fully understand the spirit of the present disclosure. Hence, it should be noted that the present disclosure is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

In the present disclosure, if not specifically mention, the general expression of AlGaAs means $Al_{x1}Ga_{(1-x1)}As$, wherein $0 \leq x1 \leq 1$; the general expression of AlInP means $Al_{x2}In_{(1-x2)}P$, wherein $0 \leq x2 \leq 1$; the general expression of AlGaInP means $(Al_{y1}Ga_{(1-y1)})_{1-x3}In_{x3}P$, wherein $0 \leq x3 \leq 1$; $0 \leq y1 \leq 1$; the general expression of AlGaN means $Al_{x4}Ga_{(1-x4)}N$, wherein $0 \leq x4 \leq 1$; the general expression of AlAsSb means $AlAs_{(1-x5)}Sb_{x5}$ wherein $0 \leq x5 \leq 1$ and the general expression of InGaP means $In_{x6}Ga_{1-x6}P$, wherein $0 \leq x6 \leq 1$; the general expression of InGaAsP means $In_{x7}Ga_{1-x7}As_{1-y2}P_{y2}$, wherein $0 \leq x7 \leq 1$, $0 \leq y2 \leq 1$; the general expression of InGaAsN means $In_{x8}Ga_{1-x8}As_{1-y3}N_{y3}$, wherein $0 \leq x8 \leq 1$, $0 \leq y3 \leq 1$; the general expression of AlGaAsP means $Al_{x9}Ga_{1-x9}As_{1-y4}P_{y4}$, wherein $0 \leq x9 \leq 1$, $0 \leq y4 \leq 1$; the general expression of InGaAs means $In_{x10}Ga_{1-x10}As$, wherein $0 \leq x10 \leq 1$; the general expression of AlGaN means $Al_{x11}Ga_{1-x11}N$, wherein $0 \leq x11 \leq 1$; the general expression of InGaN means $In_{x12}Ga_{1-x12}N$, wherein $0 \leq x12 \leq 1$; the general expression of InAlGaN means $In_{x13}Al_{y5}Ga_{1-x-y}N$, wherein $0 \leq x13 \leq 1$, $0 \leq y5 \leq 1$. The content of the element can be adjusted for different purposes, such as, but not limited to, adjusting the energy gap or the peak wavelength of the light emitted from the semiconductor device when the semiconductor device includes a light-emitting device.

The compositions and dopants of each layer in the semiconductor device of the present disclosure may be determined by any suitable means, such as secondary ion mass spectrometer (SIMS).

The thickness of each layer in the semiconductor device of the present disclosure can be determined by any suitable means, such as transmission electron microscope (TEM) or scanning electron microscope (SEM) to determine the depth position of each layer on the SIMS graph.

Figure 1:
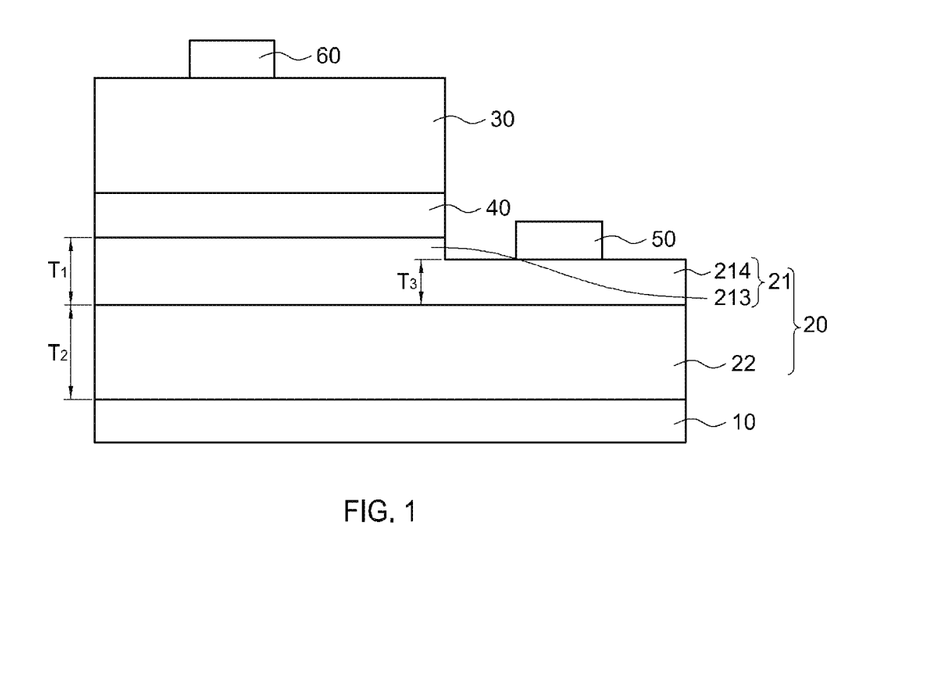
FIG. 1 is a cross-sectional diagram showing a semiconductor device according to a first embodiment of the present disclosure.

FIG. 1 is a cross-sectional diagram showing a semiconductor device according to a first embodiment of the present disclosure. The semiconductor device includes a substrate 10, a first conductivity-type semiconductor structure 20 on the substrate 10, a second conductivity-type semiconductor structure 30 on the first conductivity-type semiconductor structure 20, an active structure 40 between the first conductivity-type semiconductor structure 20 and the second conductivity-type semiconductor structure 30, a first electrode 50 electrically connected to the first conductivity-type semiconductor structure 20, and a second electrode 60 electrically connected to the second conductivity-type semiconductor structure 30. The first conductivity-type semiconductor structure 20 includes a first stack 21 and a second stack 22. The first stack 21 is between the substrate 10 and the active structure 40. The second stack 22 is between the first stack 21 and the substrate 10. In the present embodiment, the first conductivity-type is n-type, and the second conductivity-type is p-type. In the present embodiment, the first electrode 50 and the second electrode 60 are on the same side of the substrate 10. In the present embodiment, the active structure 40 emits light. In one embodiment, since the first electrode 50 and the second electrode 60 are on the same side of the substrate 10, the semiconductor device can be flip-chip mounted on another support member, and most of the light escapes to the outside of the semiconductor device from the substrate 10.

Figure 2:
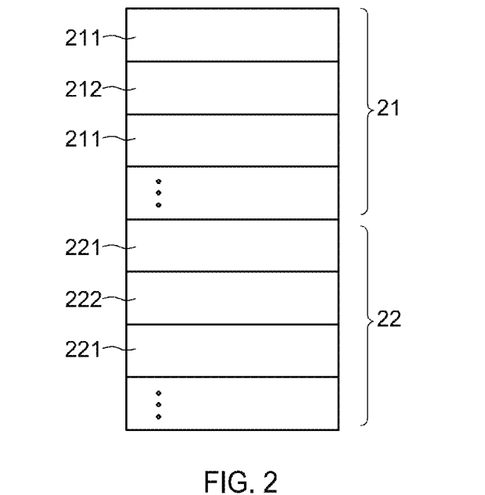
FIG. 2 is a cross-sectional diagram showing the first conductivity-type semiconductor structure according to the first embodiment of the present disclosure.

FIG. 2 is a cross-sectional diagram showing the first conductivity-type semiconductor structure 20 according to the first embodiment of the present disclosure. In the present embodiment, the first stack 21 includes alternate first layers 211 and second layers 212. The second stack 22 includes alternate third layers 221 and fourth layers 222. In one embodiment, the number of the first layers 211 is not less than 2. The number of the second layers 212 is not less than 2. The number of the third layers 221 is not less than 2. The number of the fourth layers 222 is not less than 2. A first layer 211 and an adjacent second layer 212 are considered as a pair. A third layer 221 and an adjacent fourth layer 222 are considered as a pair. Preferably, the number of the pairs of the third layers 221 and the fourth layers 222 is greater than the number of the pairs of the first layers 211 and the second layers 212. Specifically, the number of the first layers 211 is less than the number of the third layers 221. The number of the second layers 212 is less than the number of the fourth layers 222. Preferably, the number of the pairs of the third layers 221 and the fourth layers 222 are not less than 10, and not more than 50. Preferably, the number of the pairs of the first layers 211 and the second layers 212 is not less than 5, and is not more than 30.

Figure 3:
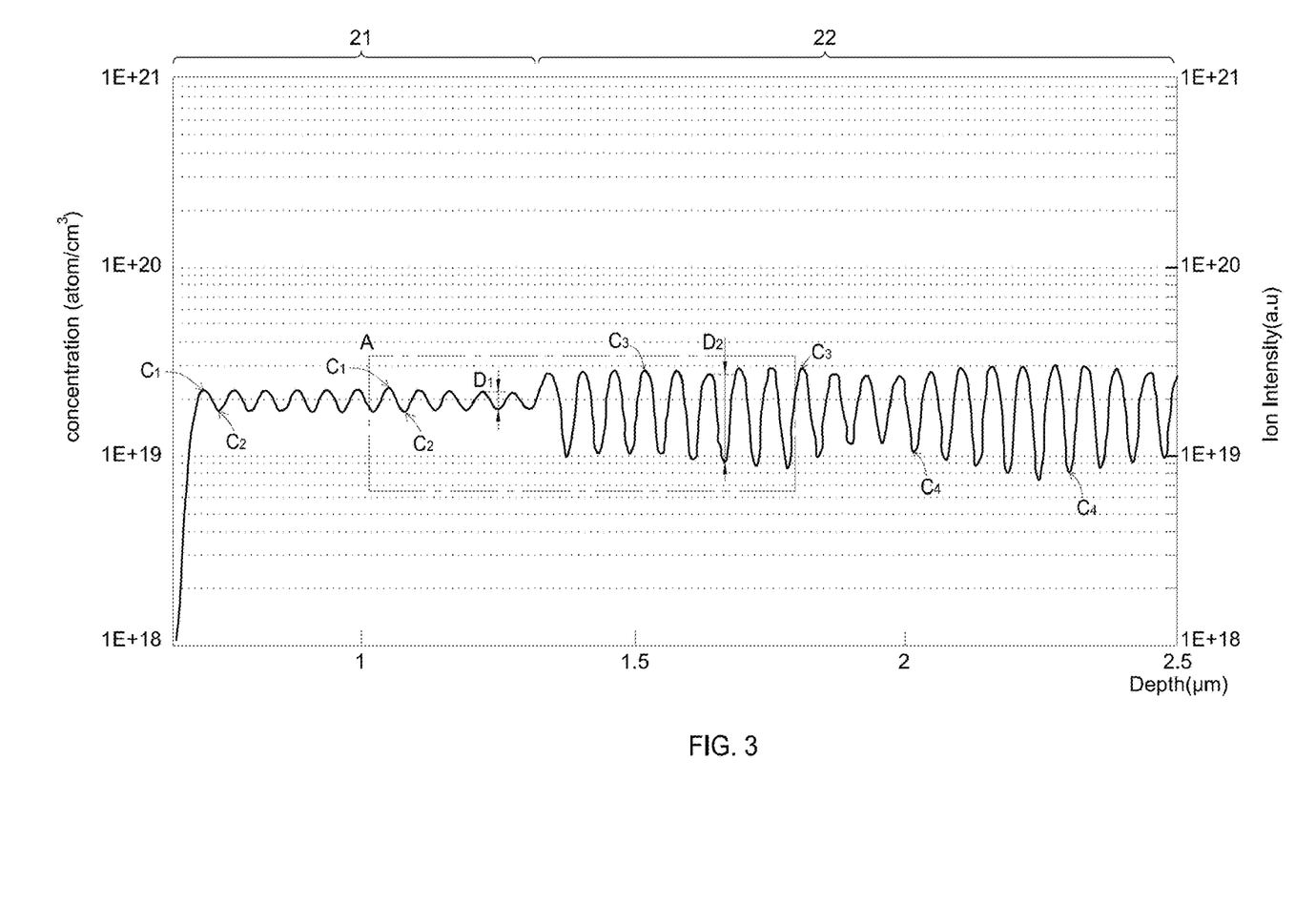
FIG. 3 is a graph showing a relation between the concentration or and the depth position in a part of the semiconductor device according to the first embodiment of the present disclosure.

FIG. 3 is a graph showing a relation between the concentration and the depth position in a part of the semiconductor device according to the first embodiment of the present disclosure. In the present embodiment, the first layers 211, the second layers 212, the third layers 221, and the fourth layers 222 include an n-type dopant and are with n-type conductivity. The n-type dopant includes Si or Te. In the present embodiment, the n-type dopant includes Si. Each of the first layers 211 has a first doping concentration $C_1$, each of the second layers 212 has a second doping concentration $C_2$, each of the third layers 221 has a third doping concentration $C_3$, and each of the fourth layers 222 has a fourth doping concentration $C_4$.

Referring to FIG. 3, the first doping concentration $C_1$ of one of the first layers 211 is greater than the second doping concentration $C_2$ of one of the second layers 212. The third doping concentration $C_3$ of one of the third layers 221 is greater than the fourth doping concentration $C_4$ of one of the fourth layers 222. The third doping concentration $C_3$ of one of the third layers 221 is greater than the first doping concentration $C_1$ of one of the first layers 211. The second doping concentration $C_2$ of one of the second layers 212 is greater than the fourth doping concentration $C_4$ of one of the fourth layers 222. Preferably, the first doping concentration $C_1$ of each of the first layers 211 is greater than the second doping concentration $C_2$ of each of the second layers 212. Preferably, the third doping concentration $C_3$ of each of the third layers 221 is greater than the fourth doping concentration $C_4$ of each of the fourth layers 222. Preferably, the third doping concentration $C_3$ of each of the third layers 221 is greater than the first doping concentration $C_1$ of each of the first layers 211. Preferably, the second doping concentration $C_2$ of each of the second layers 212 is greater than the fourth doping concentration $C_4$ of each of the fourth layers 222. Preferably, the maximum of the third doping concentration $C_3$ of one of the third layers 221 is at least 1.5 times greater than the minimum of the fourth doping concentration $C_4$ of one of the fourth layers 222, and preferably, not more than 10 times greater than the minimum of the fourth doping concentration $C_4$ of one of the fourth layers 222. In one embodiment, the maximum of the third doping concentrations $C_3$ of each of the third layers 221 is at least 1.5 times greater than the minimum of the fourth doping concentrations $C_4$ of each of the fourth layers 222, and preferably, not more than 10 times greater than the minimum of the fourth doping concentration $C_4$ of each of the fourth layers 222.

In one embodiment, the maximum of the first doping concentration $C_1$ of one of the first layers 211 is between $5 \times 10^{18}/cm^3$ and $5 \times 10^{19}/cm^3$ both inclusive, and preferably, between $1 \times 10^{19}/cm^3$ and $3 \times 10^{19}/cm^3$ both inclusive. The minimum of the second doping concentration $C_2$ of one of the second layers 212 is between $5 \times 10^{18}/cm^3$ and $5 \times 10^{19}/cm^3$ both inclusive, and preferably, between $1 \times 10^{19}/cm^3$ and $3 \times 10^{19}/cm^3$ both inclusive. The maximum of the third doping concentration $C_3$ of one of the third layers 221 is between $5 \times 10^{18}/cm^3$ and $1 \times 10^{20}/cm^3$ both inclusive, and preferably, between $1 \times 10^{19}/cm^3$ and $6 \times 10^{19}/cm^3$ both inclusive. The minimum of the fourth doping concentration $C_4$ of one of the fourth layers 222 is between $1 \times 10^{18}/cm^3$ and $5 \times 10^{19}/cm^3$ both inclusive, and preferably, between $5 \times 10^{18}/cm^3$ and $3 \times 10^{19}/cm^3$ both inclusive.

In the first embodiment, the maximum of the first doping concentration $C_1$ of each of the first layers 211 is between $5 \times 10^{18}/cm^3$ and $5 \times 10^{19}/cm^3$ both inclusive, and preferably, between $1 \times 10^{19}/cm^3$ and $3 \times 10^{19}/cm^3$ both inclusive. The minimum of the second doping concentration $C_2$ of each of the second layers 212 is between $5 \times 10^{18}/cm^3$ and $5 \times 10^{19}/cm^3$ both inclusive, and preferably, between $1 \times 10^{19}/cm^3$ and $3 \times 10^{19}/cm^3$ both inclusive. The maximum of the third doping concentration $C_3$ of each of the third layers 221 is between $5 \times 10^{18}/cm^3$ and $1 \times 10^{20}/cm^3$ both inclusive, and preferably, between $1 \times 10^{19}/cm^3$ and $6 \times 10^{19}/cm^3$ both inclusive. The minimum of the fourth doping concentration $C_4$ of each of the fourth layers 222 is between $1 \times 10^{18}/cm^3$ and $5 \times 10^{19}/cm^3$ both inclusive, and preferably, between $5 \times 10^{18}/cm^3$ and $3 \times 10^{19}/cm^3$ both inclusive.

Referring to FIG. 3, a first difference ($D_1$) between the maximum of the first doping concentration $C_1$ of one of the first layers 211 and the minimum of the second doping concentration $C_2$ of one of the second layers 212 is less than a second difference ($D_2$) between the maximum of the third doping concentration $C_3$ of one of the third layers 221 and the minimum of the fourth doping concentration $C_4$ of one of the fourth layers 222. Preferably, A first difference ($D_1$) between the maximum of the first doping concentration $C_1$ of one of the first layers 211 and the minimum of the second doping concentration $C_2$ of the adjacent second layer 212 is less than a second difference ($D_2$) between the maximum of the third doping concentration $C_3$ of one of the third layers 221 and the minimum of the fourth doping concentration $C_4$ of the adjacent fourth layer 222. More preferably, the first difference ($D_1$) between the maximum of first doping concentration $C_1$ of each of the first layers 211 and the minimum of the second doping concentration $C_2$ of the adjacent second layer 212 is less than the second difference ($D_2$) between the maximum of the third doping concentration $C_3$ of each of the third layers 221 and the minimum of the fourth doping concentration $C_4$ of the adjacent fourth layer 222.

In the first embodiment, the second difference ($D_2$) is at least 1.5 times greater than the first difference ($D_1$), and preferably, is 2 times greater than the first difference ($D_1$), and more preferably, not more than 20. In the present embodiment, the first difference between ($D_1$) the maximum of the first doping concentration $C_1$ of one of the first layers 211 and the minimum of the second doping concentration $C_2$ of the adjacent second layer 212 is about $4 \times 10^{18}/cm^3$. The second difference ($D_2$) between the maximum of the third doping concentration $C_3$ of one of the third layers 221 and the minimum of the fourth doping concentration $C_4$ of the adjacent fourth layer 222 is about $2.1 \times 10^{19}/cm^3$.

Figure 4:
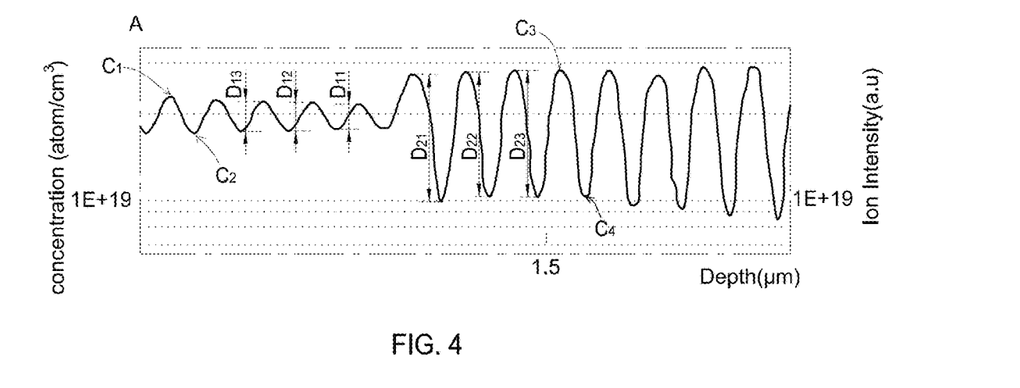
FIG. 4 is an enlarged graph of part A shown in FIG. 3.

In one embodiment, the first differences ($D_1$) between the maximums of the first doping concentrations $C_1$ of at least two consecutive first layers 211 and the minimums of the second doping concentrations $C_2$ of two or more adjacent second layers 212 are less than the second differences ($D_2$) between the maximums of the doping concentrations $C_3$ of at least two consecutive third layers 221 and the minimums of the fourth doping concentrations $C_4$ of two or more adjacent fourth layers 222. As shown in FIG. 4, which is an enlarged graph of part A shown in FIG. 3. The first differences ($D_{11}$, $D_{12}$, $D_{13}$) between the maximums of the first doping concentrations $C_1$ of three consecutive first layers 211 and the minimums of the second doping concentrations $C_2$ of three adjacent second layers 212 are less than the second differences ($D_{21}$, $D_{22}$, $D_{23}$) between the maximums of the third doping concentrations $C_3$ of three consecutive third layers 221 and the minimums of the fourth doping concentrations $C_4$ of three adjacent fourth layers 222. That is, $D_{11}, D_{12}, D_{13} < D_{21}, D_{22}, D_{23}$.

In one embodiment, a ratio of the maximums of the first doping concentrations $C_1$ of any two of the first layers 211 is between 0.3 and 3 both inclusive, and preferably between 0.9 and 1.1 both inclusive. In one embodiment, a ratio of the minimums of the second doping concentrations $C_2$ of any two of the second layers 212 is between 0.3 and 3 both inclusive, and preferably between 0.9 and 1.1 both inclusive. In one embodiment, a ratio of the maximums of the third doping concentrations $C_3$ of any two of the third layers 221 is between 0.3 and 3 both inclusive, and preferably between 0.5 and 2 both inclusive. In one embodiment, a ratio of the minimums of the fourth doping concentrations $C_4$ of any two of the fourth layers 222 is between 0.3 and 3 both inclusive, and preferably between 0.5 and 2 both inclusive.

The first layers 211, the second layers 212, the third layers 221 and the fourth layers 222 include Group III-V semiconductor material. Preferably, the first layers 211, the second layers 212, the third layers 221 and the fourth layers 222 include $In_aAl_bGa_{1-a-b}N$, wherein $0 \le a \le 1$, $0 \le b \le 1$. In one embodiment, the first layers 211, the second layers 212, the third layers 221 and the fourth layers 222 include the same material. In another embodiment, the first layers 211 and the third layers 221 include the same material, the second layers 212 and the fourth layers 222 include the same material, and the material of the first layers 211 is different from the material of the second layers 212. In the first embodiment, the first layers 211, the second layers 212, the third layers 221 and the fourth layers 222 include GaN. In another embodiment, the first layers 211, the second layers 212 and the fourth layers 222 include GaN, and the third layers 221 include $Al_cGa_{1-c}N$, wherein $0 < c \le 0.1$. In another embodiment, the third layers 221, the second layers 212 and the fourth layers 222 include GaN, and the first layers 211 include $Al_cGa_{1-c}N$, wherein $0 < c \le 0.1$. In another embodiment, the second layers 212 and the fourth layers 222 include GaN, and the first layers 211 and the third layers 221 include $Al_cGa_{1-c}N$, wherein $0 < c \le 0.1$.

In one embodiment, each of the first layers 211 has a first thickness, each of the second layers 212 has a second thickness, each of the third layers 221 has a third thickness, and each of the fourth layers 222 has a fourth thickness. Each of the first thicknesses and/or each of the third is not less than 100 Å, and preferably, not greater than 800 Å. Each of the second thicknesses and/or each of the fourth thicknesses is not less than 20 Å, and preferably, not less than 100 Å, and more preferably, not greater than 800 Å. If the first thicknesses or the third thicknesses are greater than 800 Å, the epitaxial quality of the semiconductor device will be poor. The second thicknesses less than 20 Å or the fourth thicknesses less than 20 Å will lead to a poor current spreading. The second thicknesses not less than 100 Å or the fourth thicknesses not less than 100 Å will improve the current spreading. Preferably, each of the first thicknesses, each of the second thicknesses, each of the third thicknesses and each of the fourth thicknesses is between 200 Å and 500 Å. Referring to FIG. 3, the distance between the depth positions where two maximums of the first doping concentrations $C_1$ of any two adjacent first layers 211 lie respectively is substantially equal to the sum of the first thickness of the first layer 211 and the second thickness of the adjacent second layer 212 in a pair. The distance between the depth positions where two maximums of the third doping concentrations $C_3$ of any two adjacent third layers 221 lie respectively is substantially equal to the sum of the third thickness of the third layer 221 and the fourth thickness of the adjacent fourth layer 222 in a pair.

In the present embodiment, a ratio of the first thicknesses of any two of the first layers 211 is between 0.85 and 1.15 both inclusive, and preferably between 0.9 and 1.1 both inclusive. In one embodiment, a ratio of the second thicknesses of any two of the second layers 212 is between 0.85 and 1.15 both inclusive, and preferably between 0.9 and 1.1 both inclusive. In one embodiment, a ratio of the third thicknesses of any two of the third layers 221 is between 0.85 and 1.15 both inclusive, and preferably between 0.9 and 1.1 both inclusive. In one embodiment, a ratio of the fourth thicknesses of any two of the fourth layers 222 is between 0.85 and 1.15 both inclusive, and preferably between 0.9 and 1.1 both inclusive.

In one embodiment, a ratio of the first thickness of one of the first layers 211 to the second thickness of one of the second layers 212 is between 0.85 and 10 both inclusive. In one embodiment, a ratio of the first thickness of each of the first layers 211 to the second thickness of each of the second layers 212 is between 0.85 and 10 both inclusive. In the present embodiment, a ratio of the first thickness of one of the first layers 211 to the second thickness of one of the second layers 212 is between 0.85 and 1.15 both inclusive, and more preferably, between 0.9 and 1.1 both inclusive. Specifically, a ratio of the first thickness of each of the first layers 211 to the second thickness of each of the second layers 212 is between 0.85 and 1.15 both inclusive, and preferably between 0.9 and 1.1 both inclusive.

In one embodiment, a ratio of the first thickness of one of the first layers 211 to the third thickness of one of the third layers 221 is between 0.85 and 10 both inclusive. In one embodiment, a ratio of the first thickness of each of the first layers 211 to the third thickness of each of the third layers 221 is between 0.85 and 10 both inclusive. In the present embodiment, a ratio of the first thickness of one of the first layers 211 to the third thickness of one of the third layers 221 is between 0.85 and 1.15 both inclusive, and preferably between 0.9 and 1.1 both inclusive. Specifically, a ratio of the first thickness of each of the first layers 211 to the third thickness of each of the third layers 221 is between 0.85 and 1.15 both inclusive, and preferably between 0.9 and 1.1 both inclusive.

In one embodiment, a ratio of the first thickness of one of the first layers 211 to the fourth thickness of one of the fourth layers 222 is between 0.85 and 10 both inclusive. In one embodiment, a ratio of the first thickness of each of the first layers 211 to the fourth thickness of each of the fourth layers 222 is between 0.85 and 10 both inclusive. In the present embodiment, a ratio of the first thickness of one of the first layers 211 to the fourth thickness of one of the fourth layers 222 is between 0.85 and 1.15 both inclusive, and more preferably, between 0.9 and 1.1 both inclusive. Specifically, a ratio of the first thickness of each of the first layer 211 to the fourth thickness of each of the fourth layers 222 is between 0.85 and 1.15 both inclusive, and preferably between 0.9 and 1.1 both inclusive.

The active structure 40 includes alternate well layers (not shown) and barrier layers (not shown). Each barrier layer has a first band gap. Each well layer has a second band gap. The first band gap is not less than the second band gap, and preferably, is greater than the second band gap. The well layers and the barrier layers include Group III-V semiconductor material. In the present embodiment, the well layers include $In_jGa_{1-j}N$, wherein $0 < j \le 1$. The barrier layers include $Al_kGa_{1-k}N$, wherein $0 \le k \le 1$. In the present embodiment, the barrier layers include GaN. In another embodiment, $0<k\leq 0.2$. In the present embodiment, each barrier layer has a thickness not greater than 20 nm, and not less than 3 nm. Specifically, each well layer has a thickness less than the thickness of one of the barrier layers. The thicknesses of the well layers are not greater than 10 nm, and preferably, not less than 1 nm.

Referring to FIG. 1, the first stack 21 has a first total thickness ($T_1$), and the second stack 22 has a second total thickness ($T_2$), wherein the second total thickness ($T_2$) is greater than the first total thickness ($T_1$). In one embodiment, the second total thickness ($T_2$) is at least two times thicker than the first total thickness ($T_1$). Preferably, the second total thickness ($T_2$) is not more than five times thicker than the first total thickness ($T_1$). In the first embodiment, the first total thickness ($T_1$) is between 0.3 μm and 2 μm both inclusive, and preferably, between 0.5 μm and 1 μm both inclusive. The second total thickness ($T_2$) is between 0.5 μm and 5 μm both inclusive, and preferably, between 1 μm and 2.5 μm both inclusive. The first stack 21 further includes a first part 213 and a second part 214 adjacent to the first part 213, wherein the first part 213 has the first total thickness ($T_1$), and the second part 214 has a third total thickness ($T_3$) less than the first total thickness ($T_1$). Preferably, the third total thickness ($T_3$) is not less than 100 nm for lowering the forward voltage, and preferably, is not more than 500 nm. The first electrode 50 is directly on the second part 214. That is, the first electrode 50 is vertically overlapped with the second part 214. That is, the first electrode 50 is overlapped with the second part 214 along a direction from the substrate 10 toward the active structure 40. Specifically, the first electrode 50 is not overlapped with the first part 213 along a direction from the substrate 10 toward the active structure 40. In one embodiment, the first electrode 50 is in direct contact with one of the first layers 211. In one embodiment, the first electrode 50 is in direct contact with one of the second layers 212.

The semiconductor device of the present disclosure includes the first conductivity-type semiconductor structure 20 including the first stack 21 and the second stack 22. The semiconductor device of the present disclosure is with improved electrical over stress (EOS) character and is with improved lateral current spreading. Furthermore, compared to a semiconductor device without including the first conductivity-type semiconductor structure 20 of the present disclosure, the semiconductor device of the present disclosure distributes the electrons more evenly through the well layers. As a result, the recombination rate in the well layers can be increased, and the light-emission efficiency of the semiconductor device of the present disclosure is improved thus.

Figure 5:
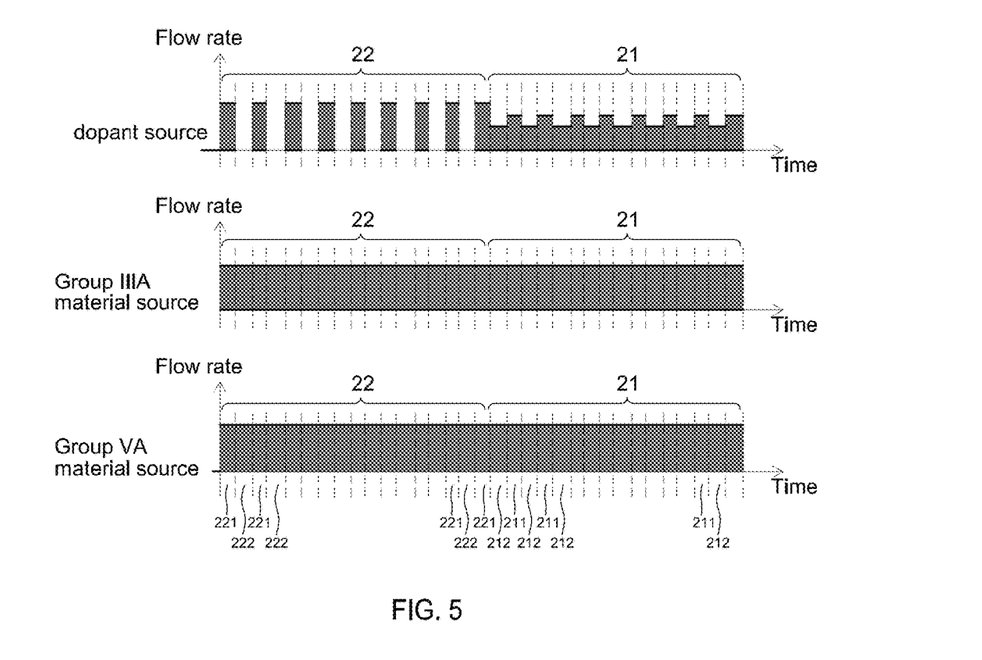
FIG. 5 is a diagram showing a method for making the semiconductor device according to the first embodiment of the present disclosure.

FIG. 5 is a diagram showing a method for making the semiconductor device according to the first embodiment of the present disclosure. In the present embodiment, the first conductivity-type semiconductor structure 20, the second conductivity-type semiconductor structure 30 and the active structure 40 are formed by epitaxial growth by MOCVD. The method includes steps of: providing a substrate 10; forming a second stack 22 on the substrate 10; and forming a first stack 21 on the second stack 22. The step of forming the second stack 22 is operated at a first temperature greater than 800 degrees Celsius, and preferably greater than 900 degrees Celsius, and more preferably not more than 1200 degrees Celsius. The step of forming the first stack 21 is operated at a second temperature greater than 800 degrees Celsius, and preferably greater than 900 degrees Celsius, and more preferably not more than 1200 degrees Celsius. Preferably, the first temperature and the second temperature are substantially the same.

The step of forming the second stack 22 on the substrate 10 includes steps of forming a third layer 221 and forming a fourth layer 222. The steps of forming the third layer 221 and forming the fourth layer 222 are repeated more than once such that the third layers 221 and the fourth layers 222 are stacked alternately. Preferably, the step of forming the third layer 221 includes providing a dopant source at a first flow rate, providing a group IIIA material source and providing a group VA material source. The step of forming the fourth layer 222 includes providing a dopant source at a second flow rate, providing a group IIIA material source and providing a group VA material source. The second flow rate is less than the first flow rate. In the present embodiment, the second flow rate is 0. That is, the dopant source is only flowing into the chamber of MOCVD when growing the third layers 221 while the dopant source is stopped when growing the fourth layers 222. In one embodiment, the dopant in the fourth layers 222 is unintentionally doped into the fourth layers 222. That is, the dopant in the third layer 221 may diffuse into the adjacent fourth layers 222. In another embodiment, the dopant source provided in the step of forming the third layers 221 may remain in the chamber of MOCVD during the process of forming the fourth layers 222.

The step of forming the first stack 21 on the second stack 22 includes steps of forming a first layer 211 and forming a second layer 212. The steps of forming the first layer 211 and forming the second layer 212 are repeated more than once such that the first layers 211 and the second layers 212 are stacked alternately. Preferably, the step of forming the first layer 211 includes providing a dopant source at a third flow rate, providing a group IIIA material source and providing a group VA material source. The step of forming the second layer 212 includes providing a dopant source at a fourth flow rate, providing a group IIIA material source and providing a group VA material source. The fourth flow rate is less than the third flow rate. Preferably, the fourth flow rate is greater than the second flow rate. The third flow rate is less than the first flow rate. In the present embodiment, the first flow rate is greater than the third flow rate, the third flow rate is greater than the fourth flow rate, and the fourth flow rate is greater than the second flow rate. Preferably, during the process of forming the first stack 21, the dopant source is flowing into the chamber constantly. However, the amount of the dopant source during the growing of the first layers 211 is more than the amount of the dopant source during the growing of the second layers 212. Preferably, the amount of the dopant source during the growing of the third layers 221 is more than the amount of the dopant source during the growing of the first layers 211. In another embodiment, the dopant in the second layers 212 is unintentionally doped into the second layers 212. That is, the fourth flow rate is 0, but preferably, the fourth flow rate is greater than 0. In one embodiment, the dopant in the first layers 211 may diffuse into the adjacent second layers 212. In another embodiment, the dopant source provided in the step of forming the first layers 211 may remain in the chamber of MOCVD during the process of forming the second layers 212.

In the first embodiment, the group IIIA material source provided in the step of forming the third layer 221, the step of forming the fourth layer 222, the step of forming the first layer 211 and the step of forming the second layer 212 are the same. The flow rates of the group IIIA material sources provided in the step of forming the third layer 221, the step of forming the fourth layer 222, the step of forming the first layer 211 and the step of forming the second layer 212 are substantially the same.

In the first embodiment, the group VA material sources provided in the step of forming the third layer 221, the step of forming the fourth layer 222, the step of forming the first layer 211 and the step of forming the second layer 212 are the same. The flow rates of the group VA material sources provided in the step of forming the third layer 221, the step of forming the fourth layer 222, the step of forming the first layer 211 and the step of forming the second layer 212 are substantially the same.

In the first embodiment, the dopant sources provided in the step of forming the third layer 221, the step of forming the fourth layer 222, the step of forming the first layer 211 and the step of forming the second layer 212 are the same. In the present embodiment, the dopant sources include silane ($SiH_4$).

In the present disclosure, the group IIIA material sources include trimethylgallium (TMGa), triethylgallium (TEGa), trimethylaluminum (TMAl), or trimethylindium (TMIn). The group VA material sources include Ammonia ($NH_3$). Dopant sources include silane ($SiH_4$) or bis-cyclopentadienyl magnesium ($Cp_2Mg$).

Figure 6:
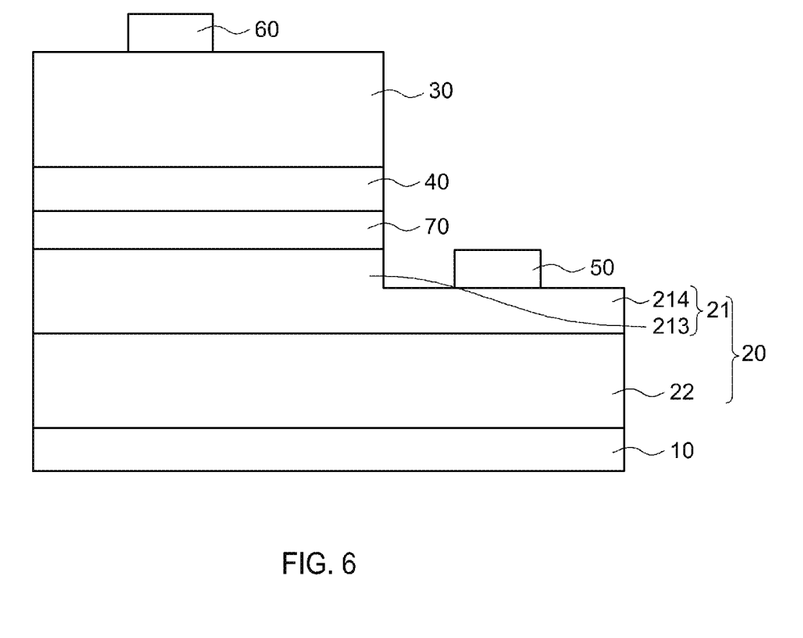
FIG. 6 is a cross-sectional diagram showing a semiconductor device according to a second embodiment of the present disclosure.

FIG. 6 is a cross-sectional diagram showing a semiconductor device according to a second embodiment of the present disclosure. The semiconductor device in accordance with the second embodiment of the present disclosure includes substantially the same structure as the first embodiment, and the difference is that the semiconductor device in the present embodiment further includes a semiconductor stack 70 between the first conductivity-type semiconductor structure 20 and the active structure 40. The semiconductor stack 70 may include alternate first semiconductor layers (not shown) and second semiconductor layers (not shown), wherein a first semiconductor layer and an adjacent second semiconductor layer are considered as a pair. The first semiconductor layers and the second semiconductor layers include Group III-V semiconductor material. The band gap of the first semiconductor layer is greater than the band gap of the second semiconductor layer in the pair. The thickness of one of the first semiconductor layers is greater than the thickness of one of the second semiconductor layers. Preferably, the thickness of each of the first semiconductor layers is greater than the thickness of each of the second semiconductor layers. The first semiconductor layers include $In_d Al_e Ga_{1-d-e}N$, wherein $0 \leq d \leq 1$, $0 \leq e \leq 1$. The second semiconductor layers include $In_f Ga_{1-f}N$, wherein $0 < f \leq 1$. In one embodiment, the first semiconductor layers include GaN. The number of the pairs of the first semiconductor layers and the second semiconductor layers is not less than 3, and preferably, not less than 5, and preferably, is not greater than 40.

The total thickness of the first semiconductor layers, that is, the sum of the thicknesses of the first semiconductor layers, is greater than the first thickness of one of the first layers 211. Preferably, the total thickness of the first semiconductor layers is greater than the second thickness of one of the second layers 212. Preferably, the total thickness of the first semiconductor layers is greater than the third thickness of one of the third layers 221. Preferably, the total thickness of the first semiconductor layers is greater than the fourth thickness of one of the fourth layers 222. In the second embodiment, the thickness of each of the first semiconductor layers is about 4 nm. The number of the pairs of the first semiconductor layers and the second semiconductor layers is 15. Each of the third thickness, the second thickness, the first thickness, and the fourth thickness is about 40 nm. In one embodiment, the thickness of one of the first semiconductor layers is thinner than the first thickness of one of the first layers 211. The thickness of one of the first semiconductor layers is thinner than the second thickness of one of the second layers 212. The thickness of one of the first semiconductor layers is thinner than the third thickness of one of the third layers 221. The thickness of one of the first semiconductor layers is thinner than the fourth thickness of one of the fourth layers 222. Preferably, the thickness of each of the first semiconductor layers is thinner than the first thickness of one of the first layers 211, the thickness of each of the first semiconductor layers is thinner than the second thickness of each of the second layers 212, the thickness of each of the first semiconductor layers is thinner than the third thickness of each of the third layers 221, the thickness of each of the first semiconductor layers is thinner than the fourth thickness of each of the fourth layers 222 for improving current spreading and epitaxial quality. In another embodiment, the thickness of one of the first semiconductor layers is about 4 nm. In another embodiment, the thickness of one of the first semiconductor layers is between 3 nm and 80 nm both inclusive. In another embodiment, the total thickness of the first semiconductor layers is between 100 nm and 500 nm both inclusive.

In one embodiment, the total thickness of the second semiconductor layers, that is the sum of the thicknesses of the second semiconductor layers, is less than the first thickness of one of the first layers 211. Preferably, the total thickness of the second semiconductor layers is less than the second thickness of one of the second layers 212. Preferably, the total thickness of the second semiconductor layers is less than the third thickness of one of the third layers 221. Preferably, the total thickness of the second semiconductor layers is less than the fourth thickness of one of the fourth layers 222. In the second embodiment, the thickness of each of the second semiconductor layers is about 1 nm. The number of the pairs of the first semiconductor layers and the second semiconductor layers is 15. Preferably, the thickness of one of the second semiconductor layers is thinner than the first thickness of one of the first layers 211. The thickness of one of the second semiconductor layers is thinner than the second thickness of one of the second layers 212. The thickness of one of the second semiconductor layers is thinner than the third thickness of one of the third layers 221. The thickness of one of the second semiconductor layers is thinner than the fourth thickness of one of the fourth layers 222. Preferably, the thickness of each of the second semiconductor layers is thinner than the first thickness of each of the first layers 211, the thickness of each of the second semiconductor layers is thinner than the second thickness of each of the second layers 212, the thickness of each of the second semiconductor layers is thinner than the third thickness of each of the third layers 221, the thickness of each of the second semiconductor layers is thinner than the fourth thickness of each of the fourth layers 222 for improving current spreading and epitaxial quality.

In one embodiment, the thickness of one of the well layers is between the first thickness of one of the first layers 211 and the thickness of one of the second semiconductor layers. In one embodiment, the thickness of one of the well layers is between the second thickness of one of the second layers 212 and the thickness of one of the second semiconductor layers. In one embodiment, the thickness of one of the well layers is between the third thickness of one of the third layers 221 and the thickness of one of the second semiconductor layers. In one embodiment, the thickness of one of the well layers is between the fourth thickness of one of the fourth layers 222 and the thickness of one of the second semiconductor layers. In the present embodiment, the thickness of each of the well layers is between the first thickness of each of the first layers 211 and the thickness of each of the second semiconductor layers. Preferably, the thickness of each of the well layers is between the second thickness of each of the second layers 212 and the thickness of each of the second semiconductor layers. Preferably, the thickness of each of the well layers is between the third thickness of each of the third layers 221 and the thickness of each of the second semiconductor layers. Preferably, the thickness of each of the well layers is between the fourth thickness of each of the fourth layers 222 and the thickness of each of the second semiconductor layers.

In the second embodiment, the semiconductor stack 70 has a doping concentration lower than the fourth doping concentration $C_4$ of one of the fourth layers 222, and preferably, is lower than the fourth doping concentration $C_4$ of each of the fourth layers 222. Specifically, each of the first semiconductor layers includes has a doping concentration. Specifically, each of the second semiconductor layers has a doping concentration. In one embodiment, the doping concentration of one of the first semiconductor layers is greater than the doping concentration of one of the second semiconductor layers. Preferably, the doping concentration of each of the first semiconductor layers is greater than the doping concentration of each of the second semiconductor layers. Preferably, the doping concentration of one of the first semiconductor layers is less than the fourth doping concentration $C_4$ of one of the fourth layers 222. More preferably, the doping concentration of each of the first semiconductor layers is less than the fourth doping concentration $C_4$ of each of the fourth layers 222. In one embodiment, the doping concentration of one of the first semiconductor layers or the doping concentration of one of the second semiconductor layers is between $1 \times 10^{17}/cm^3$ and $5 \times 10^{18}/cm^3$ both inclusive, and preferably, the doping concentration of each of the first semiconductor layers or the doping concentration of each of the second semiconductor layers is between $1 \times 10^{17}/cm^3$ and $5 \times 10^{18}/cm^3$ both inclusive. The semiconductor device of the present disclosure includes the semiconductor stack 70. The semiconductor device is with lower forward voltage and improved light-emitting efficiency.

In one embodiment, the semiconductor device of the present disclosure further includes a nitride-containing layer (not shown) between the semiconductor stack 70 and the first conductivity-type semiconductor structure 20. In addition, the nitride-containing layer includes an n-type dopant and is with n-type conductivity. In addition, the n-type dopant in the nitride-containing layer is the same as the n-type dopant in the first conductivity-type semiconductor structure 20. The doping concentration of the nitride-containing layer is lower than the first doping concentration $C_1$ of one of the first layers 211, and preferably, is lower than the first doping concentration $C_1$ of each of the first layers 211. Preferably, the doping concentration of the nitride-containing layer is lower than the second doping concentration $C_2$ of one of the second layers 212, and preferably, is lower than the second doping concentration $C_2$ of each of the second layers 212. In one embodiment, the doping concentration of the nitride-containing layer is also lower than the third doping concentration $C_3$ of one of the third layers 221, and preferably, lowers than the third doping concentration $C_3$ of each of the third layers 221. In another embodiment, the doping concentration of the nitride-containing layer is also lower than the fourth doping concentration $C_4$ of one of the fourth layers 222, and preferably, is lower than the fourth doping concentrations $C_4$ of each of fourth layers 222. In another embodiment, the doping concentration of the nitride-containing layer is greater than the doping concentration of one of the first semiconductor layers or the doping concentration of one of the second semiconductor layers. Preferably, the doping concentration of the nitride-containing layer is greater than the doping concentration of each of the first semiconductor layers or the doping concentration of each of the second semiconductor. In another embodiment, the doping concentration of the nitride-containing layer is between $1 \times 10^{18}/cm^3$ and $5 \times 10^{19}/cm^3$ both inclusive, and preferably, between $5 \times 10^{18}/cm^3$ and $1 \times 10^{19}/cm^3$ both inclusive. In one embodiment, the nitride-containing layer has a thickness thicker than the first thickness of one of the first layers 211. The thickness of the nitride-containing layer is thicker than the second thickness of one of the second layers 212. The thickness of the nitride-containing layer is thicker than the third thickness of one of the third layers 221. The thickness of the nitride-containing layer is thicker than the fourth thickness of one of the fourth layers 222. Preferably, the thickness of the nitride-containing layer is thicker than the first thickness of each of the first layers 211. Preferably, the thickness of the nitride-containing layer is thicker than the second thickness of each of the second layers 212. Preferably, the thickness of the nitride-containing layer is thicker than the third thickness of each of the third layers 221. Preferably, the thickness of the nitride-containing layer is thicker than the fourth thickness of each of the fourth layers 222. In another embodiment, the nitride-containing layer has a thickness not less than 10 nm, and preferably, not more than 100 nm. In one embodiment, the nitride-containing layer includes a Group III-V semiconductor material, such as $In_mAl_nGa_{1-m-n}N$, wherein $0 \leq m \leq 1$, $0 \leq n \leq 1$. In one embodiment, the nitride-containing layer includes GaN. The nitride-containing layer can improve epitaxial quality.

In the present embodiment, the method for making a semiconductor device further includes forming a nitride-containing layer on the first stack 21. The step of forming the nitride-containing layer includes providing a dopant source at a fifth flow rate, providing a group IIIA material source and providing a group VA material source. The fifth flow rate is less than the first rate. In the present embodiment, the fifth flow rate is less than the third flow rate. The fifth flow rate is greater than the second rate. In one embodiment, the fifth flow rate less than the fourth rate. In the present embodiment, the group VA material source and the group IIIA material source provided in the step of forming the nitride-containing layer are the same as the group VA material source and the group IIIA material source provided in the first stack 21 respectively. In another embodiment, the group IIIA material source provided in the step of forming the nitride-containing layer is different from one of the group IIIA material sources provided in the first stack 21 or the second stack 22.

In one embodiment, the semiconductor device of the present disclosure further includes a spacer layer (not shown) between the nitride-containing layer and the first conductivity-type semiconductor structure 20. The spacer layer includes an n-type dopant and is with n-type conductivity. In addition, the n-type dopant in the spacer layer is the same as the n-type dopant in the first conductivity-type semiconductor structure 20. The doping concentration of the spacer layer is lower than the first doping concentrations $C_1$ of one of the first layers 211, and preferably, is lower than the first doping concentrations $C_1$ of each of the first layers 211. Preferably, the doping concentration of the spacer layer is lower than the second doping concentrations $C_2$ of one of the second layers 212, and preferably, is lower than the second doping concentrations $C_2$ of each of the second layers 212. In one embodiment, the doping concentration of the spacer layer is also lower than the third doping concentrations $C_3$ of one of the third layers 22, and preferably, is lower than the third doping concentrations $C_3$ of each of the third layers 22. In another embodiment, the doping concentration of the spacer layer is also lower than the fourth doping concentrations $C_4$ of one of the fourth layers 22, and preferably, is lower than the fourth doping concentrations $C_4$ of each of the fourth layers 22. In another embodiment, the doping concentration of the spacer layer is greater than the doping concentration of one of the first semiconductor layers or the doping concentration of one of the second semiconductor layers. Preferably, the doping concentration of the spacer layer is greater than the doping concentration of each of the first semiconductor layers or the doping concentration of each of the second semiconductor layers. In the present embodiment, the doping concentration of the spacer layer is less than the doping concentration of the nitride-containing layer. In another embodiment, the doping concentration of the spacer layer is between $1\times10^{17}/cm^3$ and $5\times10^{18}/cm^3$ both inclusive.

In one embodiment, the spacer layer has a thickness thicker than the first thickness of one of the first layers 211. The thickness of the spacer layer is thicker than the second thickness of one of the second layers 212. The thickness of the spacer layer is thicker than the third thickness of one of the third layers 221. The thickness of the spacer layer is thicker than the fourth thickness of one of the fourth layers 222. Preferably, the thickness of the spacer layer is thicker than the first thickness of each of the first layers 211. Preferably, the thickness of the spacer layer is thicker than the second thickness of each of the second layers 212. Preferably, the thickness of the spacer layer is thicker than the third thickness of each of the third layers 221. Preferably, the thickness of the spacer layer is thicker than the fourth thickness of each of the fourth layers 222. In another embodiment, the spacer layer has a thickness not less than 50 nm, and preferably, not more than 300 nm. In one embodiment, the spacer layer includes a Group III-V semiconductor material, such as $In_qAl_rGa_{1-q-r}N$, wherein $0 \leq q \leq 1$, $0 \leq r \leq 1$. In one embodiment, the spacer layer includes GaN. The spacer layer can further improve epitaxial quality of the semiconductor device.

In one embodiment, the method for making a semiconductor device further includes forming a spacer layer on the first stack 21. In the present embodiment, the step of forming a spacer layer on the first stack 21 is before the step of forming a nitride-containing layer on the first stack 21. The step of forming the spacer layer includes providing a dopant source at a sixth flow rate, providing a group IIIA material source and providing a group VA material source. The sixth flow rate is less than the fourth rate. In the present embodiment, the sixth flow rate is greater than the second flow rate. In the present embodiment, the group VA material source and the group IIIA material source provided in the step of forming the spacer layer are the same as the group VA material source and the group IIIA material source provided in the first stack 21 respectively. In another embodiment, the group IIIA material sources provided in the step of forming the spacer layer is different from one of the group IIIA material sources provided in the first stack 21 or the second stack 22. In one embodiment, the flow rates of the group VA material sources and the group IIIA material source provided in the step of forming the spacer layer are substantially the same as the flow rates of the group VA material source and the group IIIA material source provided in the step of forming the first stack 21 respectively.

In one embodiment, the second conductivity-type semiconductor structure 30 includes a semiconductor contact layer (not shown). The semiconductor contact layer includes a Group III-V semiconductor material, such as $Al_gGa_{-g}N$, wherein $0 \leq g \leq 1$. In one embodiment, $0 < g \leq 0.1$, and preferably, $0 < g \leq 0.05$ for improving the light-emission efficiency. In another embodiment, the semiconductor contact layer includes GaN. In one embodiment, the semiconductor contact layer has a thickness not more than 15 nm, and preferably, greater than 3 nm. In the second embodiment, the semiconductor contact layer includes a p-type dopant and is with p-type conductivity. The p-type dopant includes Mg, C or Zn. The concentration of the p-type dopant in the semiconductor contact layer is greater than $1\times10^{18}/cm^3$, and preferably, greater than $1\times10^{19}/cm^3$, and more preferably, between $1\times10^{19}/cm^3$ and $5\times10^{22}/cm^3$ both inclusive.

In one embodiment, the second conductivity-type semiconductor structure 30 further includes an electron blocking layer (not shown) between the active structure 40 and the semiconductor contact layer. The electron blocking layer includes a Group III-V semiconductor material and a p-type dopant. The electron blocking layer is with p-type conductivity. The p-type dopant includes Mg, C or Zn. Preferably, the p-type dopant includes Mg. Preferably, the band gap of the electron blocking layer is greater than the band gap of the semiconductor contact layer. The electron blocking layer includes $Al_hGa_{1-h}N$, wherein $0 \leq h \leq 1$, and preferably, $0 \leq h \leq 0.5$. The thickness of the electron blocking layer is thicker than that of the semiconductor contact layer.

In one embodiment, the semiconductor device further includes a buffer layer (not shown) between the substrate 10 and the first conductivity-type semiconductor structure 20. The buffer layer is for reducing dislocations and improving quality of the layers epitaxially growth thereon. In one embodiment, the buffer layer includes $Al_iGa_{1-i}N$, wherein $0 \leq i \leq 1$. In one embodiment, the buffer layer includes GaN. In another embodiment, the buffer layer 20 includes AlN. The buffer layer may be formed by physical vapor deposition (PVD) or epitaxy.

The substrate 10 has a thickness thick enough for supporting the layers or structures thereon, for example, greater than 50 μm, and more preferably, not more than 300 μm. In one embodiment, the substrate 10 includes sapphire with protrusions periodically formed on a surface thereof. In another embodiment, the substrate 10 includes conductive material including Si, Ge, Cu, Mo, MoW, AlN, ZnO or CuW.

The first electrode 50 and the second electrode 60 are for electrically connecting to an external power source and for conducting a current therebetween. The material of the first electrode 50 and the second electrode 60 include transparent conductive material or metal material, wherein the transparent conductive material includes transparent conductive oxide including indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide(GZO), tungsten doped indium oxide (IWO), zinc oxide (ZnO), or indium zinc oxide (IZO). The metal material includes Au, Pt, GeAuNi, Ti, BeAu, GeAu, Al, or ZnAu, Ni.

In one embodiment, the first electrode 50 and the second electrode 60 may be on the two opposite sides of the substrate 10 respectively. In the present embodiment, the substrate 10 may include conductive material.

The method of performing epitaxial growth includes, but is not limited to, metal-organic chemical vapor deposition (MOCVD), hydride vapor phase epitaxy (HVPE), molecular beam epitaxy (MBE), or liquid-phase epitaxy (LPE). Preferably, the method includes MOCVD.

The semiconductor device of the present disclosure includes a light-emitting diode, a laser or a power device. In one embodiment, the semiconductor device includes a light-emitting diode. The peak wavelength of the light emitted from the semiconductor device is in a visible or invisible range, and preferably, in a blue or ultraviolet range. Preferably, the peak wavelength is between 300 nm and 500 nm, and preferably, between 350 nm and 480 nm. In one embodiment, the laser is a vertical-cavity surface emitting laser (VCSEL).

In the present disclosure, in an elemental analysis spectrum, such as, but is not limited to, a SIMS spectrum, the profile of the n-type dopant in the first conductivity-type semiconductor structure 20, nitride-containing layer, spacer layer, and semiconductor stack 70 is not at the background noise level.

In accordance with a further embodiment of the present disclosure, the structures in the embodiments of the present disclosure can be combined or changed. For example, the semiconductor device as shown in FIG. 1 includes the spacer layer.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A semiconductor device, comprising:
a first conductivity-type semiconductor structure comprising a first stack and a second stack, wherein the first stack comprises alternate first layers and second layers, the second stack comprises alternate third layers and fourth layers, each of the first layers has a first doping concentration, each of the second layers has a second doping concentration, each of the third layers has a third doping concentration, and each of the fourth layers has a fourth doping concentration;
a second conductivity-type semiconductor structure on the first conductivity-type semiconductor;
an active structure between the first conductivity-type semiconductor structure and the second conductivity-type semiconductor structure; and
a first electrode;
wherein the first stack is between the active structure and the second stack, and a first difference between a maximum of the first doping concentration of one of the first layers and a minimum of the second doping concentration of one of the second layers is less than a second difference between a maximum of the third doping concentration of one of the third layers and a minimum of the fourth doping concentration of one of the fourth layers; and
wherein the first stack comprises a first part and a second part adjacent to the first part, the first part has a first total thickness greater than a third total thickness of the second part, and the first electrode is vertically overlapped with the second part.

2. The semiconductor device according to claim 1, wherein the second difference is at least 1.5 times greater than the first difference.

3. The semiconductor device according to claim 1, wherein a number of the first layers is less than a number of the third layers.

4. The semiconductor device according to claim 1, wherein a number of the second layers is less than the number of the fourth layers.

5. The semiconductor device according to claim 1, wherein the second stack has a second total thickness, and the second total thickness is greater than the first total thickness.

6. The semiconductor device according to claim 5, wherein the first total thickness is between 0.3 μm and 1.5 μm both inclusive, and the second total thickness is between 0.5 μm and 5 μm both inclusive.

7. The semiconductor device according to claim 5, wherein the second total thickness is at least two times thicker than the first total thickness.

8. The semiconductor device according to claim 1, wherein each of the first layers has a first thickness, each of the second layers has a second thickness, each of the third layers has a third thickness, each of the fourth layers has a fourth thickness, and the first thickness of one of the first layers, the second thickness of one of the second layers, the third thickness of one of the third layers and the fourth thickness of one of the fourth layers are not less than 100 Å.

9. The semiconductor device according to claim 8, wherein a ratio of the first thickness of one of the first layers to the second thickness of one of the second layers is between 0.85 and 1.15 both inclusive.

10. The semiconductor device according to claim 8, wherein a ratio of the first thickness of one of the first layers to the third thickness of one of the third layers is between 0.85 and 1.15 both inclusive.

11. The semiconductor device according to claim 1, wherein each of the first layers has a first thickness, each of the second layers has a second thickness, each of the third layers has a third thickness, each of the fourth layers has a fourth thickness, and the first thickness of one of the first layers, the second thickness of one of the second layers, the third thickness of one of the third layers and the fourth thickness of one of the fourth layers are not greater than 500 Å.

12. The semiconductor device according to claim 1, wherein the first layers, the second layers, the third layers and the fourth layers comprise $Al_cGa_{1-c}N$, wherein $0 \leq c \leq 1$.

13. The semiconductor device according to claim 1, wherein the first layers, the second layers, the third layers and the fourth layers comprise the same material.

14. The semiconductor device according to claim 1, wherein the first layers, the second layers, the third layers and the fourth layers comprise GaN.

15. The semiconductor device according to claim 1, wherein the first doping concentration of each of the first layers is greater than the second doping concentration of each of the second layers, and the third doping concentration of each of the third layers is greater than the fourth doping concentration of each of the fourth layers.

16. The semiconductor device according to claim 15, wherein the third doping concentration of each of the third layers is greater than the first doping concentration of each of the first layers, and the second doping concentration of each of the second layers is greater than the fourth doping concentration of each of the fourth layers.

17. The semiconductor device according to claim 1, wherein the third doping concentration of one of the third layers is at least two times greater than the fourth doping concentration of one of the fourth layers.

18. The semiconductor device according to claim 1, further comprising a second electrode and a substrate, wherein the substrate is under the active structure, and the first electrode and the second electrode are on the same side of the substrate.

19. The semiconductor device according to claim 1, wherein the first doping concentration of one of the first layers is between $5\times10^{18}/cm^3$ and $5\times10^{19}/cm^3$ both inclusive, the second doping concentration of one of the second layers is between $5\times10^{18}/cm^3$ and $5\times10^{19}/cm^3$ both inclusive, the third doping concentration of one of the third layers is $5\times10^{18}/cm^3$ and $1\times10^{20}/cm^3$ both inclusive, and the fourth doping concentration of one of the fourth layers is between $1\times10^{18}/cm^3$ and $5\times10^{19}/cm^3$ both inclusive.

* * * * *